United States Patent [19]

Bachman et al.

[11] Patent Number: 4,656,579
[45] Date of Patent: Apr. 7, 1987

[54] DIGITAL DATA PROCESSING SYSTEM HAVING A UNIQUELY ORGANIZED MEMORY SYSTEM AND MEANS FOR STORING AND ACCESSING INFORMATION THEREIN

[75] Inventors: Brett L. Bachman, Boston; David H. Bernstein, Ashland; Richard G. Bratt, Wayland, all of Mass.; Gerald F. Clancy, Saratoga, Calif.; Edward S. Gavrin, Lincoln, Mass.; Ronald H. Gruner, Cary; Thomas M. Jones, Chapel Hill, both of N.C.; Lawrence H. Katz, Oregon City, Oreg.; Craig J. Mundie, Cary, N.C.; John F. Pilat, Raleigh, N.C.; Michael S. Richmond, Pittsboro, N.C.; Stephen I. Schleimer, Chapel Hill, N.C.; Steven J. Wallach, Saratoga, Calif.; Walter A. Wallach, Jr., Raleigh, N.C.

[73] Assignee: Data General Corporation, Westboro, Mass.

[21] Appl. No.: 699,240

[22] Filed: Feb. 8, 1985

Related U.S. Application Data

[63] Continuation of Ser. No. 266,404, May 22, 1981, abandoned.

[51] Int. Cl.⁴ .............................................. G06F 9/10
[52] U.S. Cl. .................................................. 364/200
[58] Field of Search ............................... 364/200, 900

[56] References Cited

U.S. PATENT DOCUMENTS

| | | | |
|---|---|---|---|
| 3,878,514 | 4/1975 | Foger | 364/200 |
| 4,024,508 | 5/1977 | Bachman et al. | 364/200 |
| 4,077,058 | 2/1978 | Appell et al. | 364/200 |
| 4,204,252 | 5/1980 | Hitz et al. | 364/200 |
| 4,205,370 | 5/1980 | Hirtle | 364/200 |
| 4,225,918 | 9/1980 | Beadle et al. | 364/200 |
| 4,237,532 | 12/1980 | Borgenson et al. | 364/200 |
| 4,325,120 | 4/1983 | Colley et al. | 364/200 |

Primary Examiner—Gareth D. Shaw
Assistant Examiner—Daniel K. Dorsey
Attorney, Agent, or Firm—Robert F. O'Connell

[57] ABSTRACT

A digital computer system having a memory system organized into objects for storing items of information and a processor for processing data in response to instructions. An object identifier code is associated with each object. The objects include procedure objects and data objects. The procedure objects contain procedures including the instructions and name tables associated with the procedures. The instructions contain operation codes and names representing data. Each name corresponds to a name table entry in the name table associated with the procedure. The name table for a name contains information from which the processor may determine the location and the format for the data (e.g., an operand) represented by the name.

14 Claims, 1 Drawing Figure

DIGITAL DATA PROCESSING SYSTEM HAVING A UNIQUELY ORGANIZED MEMORY SYSTEM AND MEANS FOR STORING AND ACCESSING INFORMATION THEREIN

This application is a continuation of application Ser. No. 266,404, filed May 22, 1981, now abandoned.

CROSS REFERENCE TO RELATED APPLICATIONS

The present patent application is related to other patent applications assigned to the assignee of the present application.

BACKGROUND OF THE INVENTION

1. Field of the Invention

The present invention relates to a digital data processing system and, more particularly, to a multiprocess digital data processing system which includes a memory means organized into uniquely identified objects containing items of information which can be accessed via name tables which specify the location of an object which contains the item named.

2. Description of Prior Art

A general trend in the development of data processing systems has been towards systems suitable for use in interconnected data processing networks. Another trend has been towards data processing systems wherein the internal structure of the system is flexible, protected from users, and effectively invisible to the user and wherein the user is presented with a flexible and simplified interface to the system.

Certain problems and shortcomings affecting the realization of such a data processing system have appeared repeatedly in the prior art and must be overcome to create a data processing system having the above attributes. These prior art problems and limitations include the following topics.

First, the data processing systems of the prior art have not provided a system wide addressing system suitable for use in common by a large number of data processing systems interconnected into a network. Addressing systems of the prior art have not provided sufficiently large address spaces and have not allowed information to be permanently and uniquely identified. Prior addressing systems have not made provisions for information to be located and identified as to type or format, and have not provided sufficient granularity. In addition, prior addressing systems have reflected the physical structure of particular data processing systems. That is, the addressing systems have been dependent upon whether a particular computer was, for example, an 8, 16, 32, 64 or 128 bit machine. Since prior data processing systems have incorporated addressing mechanisms wherein the actual physical structure of the processing system is apparent to the user, the operations a user could perform have been limited by the addressing mechanisms. In addition, prior processor systems have operated as fixed word length machines, further limiting user operations.

Prior data processing systems have not provided effective protection mechanisms preventing one user from effecting another user's data and programs without permission. Such protection mechanisms have not allowed unique, positive identification of users requesting access to information, or of information, nor have such mechanisms been sufficiently flexible in operation. In addition, access rights have pertained to the users rather than to the information, so that control of access rights has been difficult. Finally, prior art protection mechanisms have allowed the use of "Trojan Horse arguments". That is, users not having access rights to certain information have been able to gain access to that information through another user or procedure having such access rights.

Yet another problem of the prior art is that of providing a simple and flexible interface user interface to a data processing system. The character of user's interface to a data processing system is determined, in part, by the means by which a user refers to and identifies operands and procedures of the user's programs and by the instruction structure of the system. Operands and procedures are customarily referred to and identified by some form of logical address having points of reference, and validity, only within a user's program. These addresses must be translated into logical and physical addresses within a data processing system each time a program is executed, and must then be frequently retranslated or generated during execution of a program. In addition, a user must provide specific instructions as to data format and handling. As such reference to operands or procedures typically comprise a major portion of the instruction stream of the user's program and requires numerous machine translations and operations to implement. A user's interface to a conventional system is thereby complicated, and the speed of execution of programs reduced, because of the complexity of the program references to operands and procedures.

A data processing system's instruction structure includes both the instructions for controlling system operations and the means by which these instructions are executed. Conventional data processing systems are designed to efficiently execute instructions in one or two user languages, for example, FORTRAN or COBOL. Programs written in any other language are not efficiently executable. In addition, a user is often faced with difficult programming problems when using any high level language other than the particular one or two languages that a particular conventional system is designed to utilize.

Yet another problem in conventional data processing systems is that of protecting the system's internal mechanisms, for example, stack mechanisms and internal control mechanisms, from accidental or malicious interference by a user.

Finally, the internal structure and operation of prior art data processing systems have not been flexible, or adaptive, in structure and operation. That is, the internal structure structure and operation of prior systems have not allowed the systems to be easily modified or adapted to meet particular data processing requirements. Such modifications may include changes in internal memory capacity, such as the addition or deletion of special purpose subsystems, for example, floating point or array processors. In addition, such modifications have significantly effected the users interface with the system. Ideally, the actual physical structure and operation of the data processing system should not be apparent at the user interface.

The present invention provides data processing system improvements and features which solve the above-described problems and limitations.

SUMMARY OF THE INVENTION

The present invention relates generally to digital computer systems and more specifically to digital computer systems employing object-based addressing of data. The digital computer system of the present invention includes a memory system including mass storage devices and one or more processors connected to the memory system.

The memory system is organized into objects containing items of information. Each object is identified by an object identifier code. Locations of items in the memory system are specified by means of the object identifier code for the object which identifies the information item and an offset specifying the bit at which information item begins in the object.

The information items include instructions which are executable by the processor. In the instructions, operands are represented by names. The system includes a name table for storing a plurality of name table entries, each name in a procedure corresponding to a name table entry. Data in the name table entry corresponding to a name specifies how the processor is to determine the location in the memory system of the object which contains the operand represented by the name, i.e., the location of said operand in the object and the format of the operand referred to by the name.

It is thus an object of the present invention to provide an improved data processing system.

It is another object of the present invention to provide a data processing system capable of use in large, interconnected data processing networks.

It is yet another object of the present invention to provide an improved addressing mechanism suitable for use in large, interconnected data processing networks.

It is a further object of the present invention to provide an improved information protection mechanism.

It is still another object of the present invention to provide a simplified and flexible user interface to a data processing system.

It is yet a further object of the present invention to provide an improved mechanism for referring to operands.

It is a still further object of the present invention to provide an instruction structure allowing efficient data processing system operation with a plurality of high level user languages.

It is a further object of the present invention to provide data processing internal mechanisms protected from user interference.

It is yet another object of the present invention to provide a data processing system having a flexible internal structure capable of multiple, concurrent operations.

Other objects, advantages and features of the present invention will be understood by those of ordinary skill in the art, after referring to the following detailed description of the preferred embodiments and drawings wherein:

Figure 1:
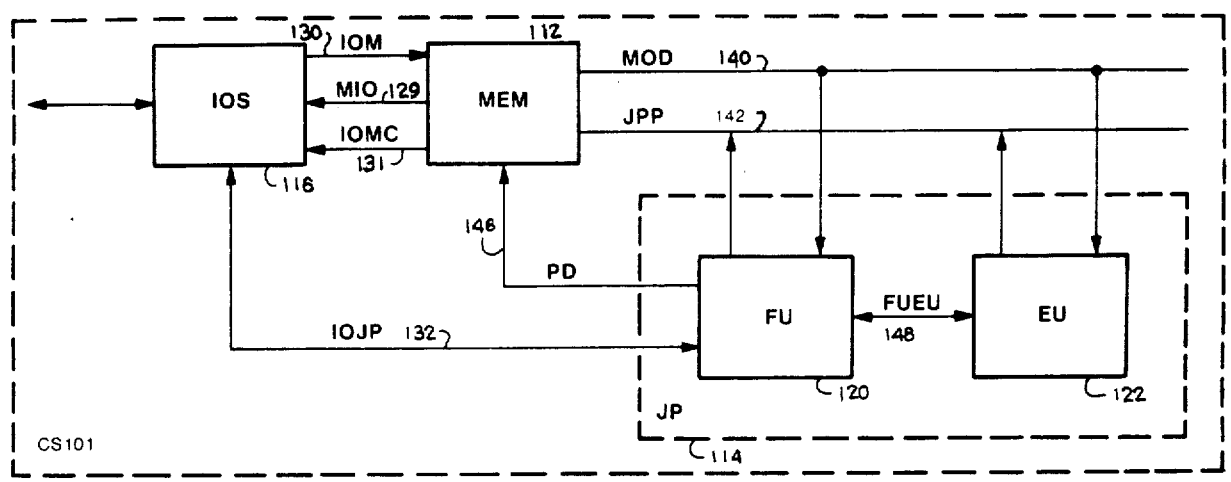
FIG. 1 is a partial block diagram of a computer system incorporating the present invention.

This application incorporates by reference the entire application, Ser. No. 616,773, filed on May 31, 1984, of Bratt et al., (a continuation of Ser. No. 266,404, filed May 22, 1981) now issued as U.S. Pat. No. 4,525,780, on June 25, 1985.

More particularly, attention is directed to FIGS. 1-3, 103, 106A-106C, 222, 238, 239 and 301-307 of the drawings in U.S. Pat. No. 4,525,780 and to that part of the descriptive portions of the specification thereof, particularly at columns 19-22, 49, 50, 61-65, 172-187 and 333-345, which relate to the subject matter of the claims herein.

What is claimed is:

1. A digital data processing system comprising:

universal memory means for storing and providing items of data, said data items including names representing other data items, said universal memory means including name tables containing name table entries corresponding to said names, each name table entry comprising data containing information for providing a logical address of data items represented by said names, said universal memory means including memory organization means for organizing said universal memory means into objects permanently identified by unique identifiers, each said data item being contained in an object and being addressable by a logical address comprising data specifying the unique identifier identifying said object and the location of said data item in said identified object;

said objects including data objects containing data and procedure objects containing at least instructors and names;

processor means connected to said universal memory means for processing said data items, said processor means including name interpretation means for providing logical addresses of data items to be processed by said processor means, said name interpretation means comprising:

means for accessing a name from said memory means;

means responsive to said accessed name for providing the name table entry corresponding to said accessed name;

means responsive to said name table entry for resolving the data in said name table entry, said resolution thereby providing the logical address of the data item represented by the name accessed from said memory means; and further wherein said processor means and said memory means further comprise: stack means responsive to certain of said instructions for storing information relating to the current state of execution of said instructions.

2. The digital computer system of claim 1, wherein said first unique identifier code fields comprise a group number sub-field and a selectable serial number sub-field, at least one said group number being uniquely and permanently assigned to said digital computer system.

3. The digital computer system of claim 2, wherein said group number sub-field and said serial number sub-field together contain 32 bits of binary information.

4. The digital data processing system of claim 3, wherein said means for generating said first unique identifier code fields includes means for obtaining said group number sub-fields and said serial number sub-fields from said memory means and for providing said group number sub-fields and said serial number sub-fields to said combining means.

5. The digital data processing system of claim 1, wherein said second unique identifier code fields, comprise an architectural clock field containing binary information representing an elapsed time interval from a selected initial time.

6. The digital data processing system of claim 5, wherein said system is one of a plurality of digital data processing systems and said selected initial time is common to each digital data processing system of said plurality of digital data processing systems.

7. The digital data processing system of claims 5 or 6, wherein said means for generating said second unique identifier code fields further comprises architectural clock means for generating architectural clock signals at predetermined intervals, and architectural counter means responsive to said clock signals for providing outputs to said processor means for counting said architectural clock signals.

8. The digital data processing system of claim 5, wherein said second unique identifier code fields contain 48 bits of binary information.

9. The digital data processing system of claim 8, wherein the least significant bit of said second unique identifier code fields represents elapsed time intervals of substantially no greater than 600 picoseconds, and the most significant bit of said second unique identifier code fields represent an elapsed time interval of substantially no less than 127 years.

10. The digital data processing system of claim 1, wherein each of said names has a uniform format.

11. The digital data processing system of claim 1 wherein:
  each of said name table entries corresponds to a name of a procedure which includes an operand, each said procedure further including a name table pointer representing the location of a name table in said memory means, each of said names including a name table index value and
  means responsive to a name table pointer and to the index value of a name for providing the address of the name table entry corresponding to said name, and said resolving means resolving the data of said name table entry of said procedure to provide the location in said memory means of the operand referred to by a corresponding name of said procedure.

12. The data processing system of claim 1, wherein said processor means further comprises:
  name cache means for providing addresses to said memory means of name table entries,
  said name cache means connected to said resolving means and responsive to said resolved data to provide name cache outputs to said memory means representing the addresses in said memory means of selected name table entries for which said name cache means has stored said resolving means ouptuts.

13. A digital data processing system in accordance with claim 1 wherein
  said memory organizing means includes
    means for generating unique identifiers in a form of unique identifier codes, each unique identifier code uniquely and permanently identifying a corresponding object, said unique identifier code generating means including
      means for generating first unique identifier code fields for uniquely identifying said digital data processing system,
      means for generating second unique identifier code fields for uniquely identifying said object, and
      means for combining a first unique identifier code field and a second unique identifier code field to form a unique identifier code for permanently identifying said corresponding object, and further wherein
  each of said name table entries comprises first data containing information for providing the logical address of a data item represented by the name accessed from said memory means and second data containing information for identifying a format of the data item referred to be said name, and
  said resolving means resolves said first and second data for providing outputs to said memory means representing the logical address in said memory means of the data item referred to by said name.

14. A digital data processing system comprising:
  universal memory means for storing and providing items of data, said data items including names representing other data items, said universal memory means including name tables containing name table entries corresponding to said names, each name table entry comprising data containing information for providing a logical address of data items represented by said name, said universal memory means including
    memory organization means for organizing said universal memory means into objects permanently identified by unique identifiers, each said data item being contained in an object and being addressable by a logical address comprising data specifying the unique identifier identifying said object and the location of said data item in said identified object; and further wherein objects which are currently used in said system are identified as active objects and said memory means further comprises means for storing the unique identifier codes of said active objects;
  processor means connected to said universal memory means for processing said data items, said processor means including neme interpretations means for providing logical addresses of data items to be processed by said processor means, said name interpretation means comprising:
    means for accessing a name from said memory means;
    means responsive to said accessed name for providing the name table entry corresponding to said accessed name and means responsive to said name table entry for resolving the data in said name table entry, said resolution thereby providing the logical address of the data item represented by the name accessed from said memory means.

* * * * *